(12) United States Patent
Lee et al.

(10) Patent No.: US 9,023,559 B2
(45) Date of Patent: May 5, 2015

(54) POSITIVE PHOTOSENSITIVE RESIN COMPOSITION, PHOTOSENSITIVE RESIN FILM PREPARED BY USING THE SAME, AND SEMICONDUCTOR DEVICE INCLUDING THE PHOTOSENSITIVE RESIN FILM

(75) Inventors: Jong-Hwa Lee, Uiwang-si (KR);
Hyun-Yong Cho, Uiwang-si (KR);
Mi-Ra Im, Uiwang-si (KR);
Hwan-Sung Cheon, Uiwang-si (KR);
Min-Kook Chung, Uiwang-si (KR);
Ji-Young Jeong, Uiwang-si (KR);
Myoung-Hwan Cha, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 99 days.

(21) Appl. No.: 13/303,197

(22) Filed: Nov. 23, 2011

(65) Prior Publication Data

US 2012/0171610 A1 Jul. 5, 2012

(30) Foreign Application Priority Data

Dec. 31, 2010 (KR) ........................ 10-2010-0140593

(51) Int. Cl.
*G03F 7/023* (2006.01)
*H01L 23/29* (2006.01)
*G03F 7/075* (2006.01)

(52) U.S. Cl.
CPC ............. *G03F 7/0233* (2013.01); *H01L 23/293* (2013.01); *G03F 7/0236* (2013.01); *G03F 7/0751* (2013.01)

(58) Field of Classification Search
CPC .............................. G03F 7/0233; G03F 7/0236
USPC .............................. 430/191, 192, 193, 18, 165
See application file for complete search history.

(56) References Cited

U.S. PATENT DOCUMENTS

| | | | |
|---|---|---|---|
| 2,772,975 A | 12/1956 | Rickers | |
| 2,797,213 A | 6/1957 | Moore | |
| 3,669,658 A | 6/1972 | Yonezawa et al. | |
| 4,812,551 A | 3/1989 | Oi et al. | |
| 5,077,378 A | 12/1991 | Mueller et al. | |
| 5,204,225 A | 4/1993 | Feely | |
| 6,294,117 B1 | 9/2001 | Rosthauser et al. | |
| 6,641,762 B2 | 11/2003 | Rosthauser et al. | |
| 6,929,890 B2 * | 8/2005 | Miyoshi et al. | 430/7 |
| 7,132,213 B2 * | 11/2006 | Masuda et al. | 430/190 |
| 7,151,126 B2 | 12/2006 | Yang et al. | |
| 8,158,324 B2 | 4/2012 | Fujita et al. | |
| 8,198,002 B2 | 6/2012 | Jung et al. | |
| 2002/0090564 A1 | 7/2002 | Suwa et al. | |
| 2003/0059706 A1 * | 3/2003 | Misumi et al. | 430/190 |
| 2008/0138744 A1 | 6/2008 | Hatanaka et al. | |
| 2010/0099041 A1 * | 4/2010 | Fujita et al. | 430/270.1 |
| 2011/0200937 A1 | 8/2011 | Orihara et al. | |
| 2012/0156622 A1 * | 6/2012 | Chung et al. | 430/286.1 |

FOREIGN PATENT DOCUMENTS

| | | |
|---|---|---|
| CN | 1330668 | 1/2002 |
| CN | 1469198 | 1/2004 |
| CN | 1513030 | 7/2004 |
| CN | 1536442 | 10/2004 |
| CN | 101727006 A | 6/2010 |
| JP | 63-96162 | 4/1988 |
| JP | 09-302221 | 11/1997 |
| JP | 2000-292913 | 10/2000 |
| JP | 2004-132996 | 4/2004 |
| KR | 10-2007-0012512 A | 1/2007 |
| KR | 10-2010-0036115 A | 4/2010 |
| KR | 10-2010-0044125 A | 4/2010 |
| TW | 200842498 | 11/2008 |
| TW | 200903163 | 1/2009 |
| WO | 2010/047264 A1 | 4/2010 |

OTHER PUBLICATIONS

Chinese Search Report in counterpart Chinese Application No. 201110378325.X dated Jan. 31, 2013, pp. 1-4.
Chinese Search Report in counterpart Chinese Application No. 201110378325.X dated Aug. 29, 2013, pp. 1-4.
Search Report in counterpart Taiwanese Application No. 100147986 dated Nov. 12, 2013, pp. 1-2.

* cited by examiner

*Primary Examiner* — John Chu

(74) *Attorney, Agent, or Firm* — Additon, Higgins & Pendleton, P.A.

(57) ABSTRACT

Disclosed is a positive photosensitive resin composition that includes (A) an alkali soluble resin; (B) a novolac resin including a repeating unit represented by Chemical Formula 6; (C) a photosensitive diazoquinone compound; (D) a silane compound; and (E) a solvent, a photosensitive resin film prepared by using the positive photosensitive resin composition, and a semiconductor device including the photosensitive resin film.

10 Claims, No Drawings

POSITIVE PHOTOSENSITIVE RESIN COMPOSITION, PHOTOSENSITIVE RESIN FILM PREPARED BY USING THE SAME, AND SEMICONDUCTOR DEVICE INCLUDING THE PHOTOSENSITIVE RESIN FILM

CROSS-REFERENCE TO RELATED APPLICATION

This application claims priority to and the benefit of Korean Patent Application No. 10-2010-0140593 filed in the Korean Intellectual Property Office on Dec. 31, 2010, the entire disclosure of which is incorporated herein by reference.

FIELD OF THE INVENTION

This disclosure relates to a positive photosensitive resin composition, a photosensitive resin film prepared by using the same, and a semiconductor device including the photosensitive resin film.

BACKGROUND OF THE INVENTION

The conventional surface protective layer and interlayer insulating layer for a semiconductor device includes a polyimide resin that can have excellent heat resistance, electrical properties, mechanical properties, and the like, as an alkali soluble resin. The polyimide resin has recently been used as a photosensitive polyimide precursor composition which can be coated easily. The photosensitive polyimide precursor composition can be coated on a semiconductor device, patterned by ultraviolet (UV) rays, developed, and heat imidized, to easily provide a surface protective layer, an interlayer insulating layer, and the like. The use of a photosensitive polyimide precursor composition may be shorten process times as compared to a conventional non-photosensitive polyimide precursor composition.

The photosensitive polyimide precursor composition can be a positive type in which an exposed part is dissolved by development, or a negative type in which the exposed part is cured and maintained. Positive type compositions can be developed by a non-toxic alkali aqueous solution.

The positive photosensitive polyimide precursor composition can include a polyimide precursor of polyamic acid, a photosensitive material of diazonaphthoquinone, and the like. However, it can be difficult to obtain a desired pattern using the positive photosensitive polyimide precursor composition because the carboxylic acid of the polyamic acid is too highly soluble in an alkali.

In order to solve this problem, a material in which a polybenzoxazole precursor is mixed with a diazonaphthoquinone compound has drawn attention. When the polybenzoxazole precursor composition is actually used, however, film loss of an unexposed part can be significantly increased, so it can be difficult to obtain a desirable pattern after the developing process.

In order to improve this, if the molecular weight of the polybenzoxazole precursor is increased, the amount of film loss of the unexposed part can be reduced. Development residue (scum), however, can be generated, so resolution may be decreased and the development duration on the exposed part may be increased.

In order to solve this problem, film loss can be suppressed in unexposed parts during development by adding a certain phenol compound to a polybenzoxazole precursor. However, the effect of suppressing the film loss of the unexposed part is insufficient. Accordingly, there is still a need to increase the effects on suppressing the film loss, along with preventing generation of the development residue (scum). In addition, there is a need for research directed to a dissolution-suppressing agent, since phenol compounds used to adjust solubility can decompose at high temperatures during curing, can undergo a side reaction, or the like, which can damage mechanical properties of a cured film.

Furthermore, when this polyimide precursor composition or polybenzoxazole precursor composition is prepared into a thermally cured film, the thermally cured film can remain in the semiconductor device and can act as a surface protective layer, and accordingly should have excellent mechanical properties such as tensile strength, elongation, Young's modulus, and the like. However, generally-used polyimide precursors or polybenzoxazole precursors tend to have inappropriate mechanical properties, and in particular, elongation, and also can have poor heat resistance.

In order to solve this problem, various additives can be added thereto or a precursor compound that is cross-linkable during the thermal curing can be used. However, while such additives and/or precursor compounds may improve mechanical properties, and in particular elongation, they may not provide desired optical properties such as sensitivity, resolution, and the like. Accordingly, there is still a need for methods that do not deteriorate these optical properties and can be still attain excellent mechanical properties.

SUMMARY OF THE INVENTION

One embodiment provides a positive photosensitive resin composition that can have excellent sensitivity, developability, film residue ratio, resolution, and a low film shrinkage ratio.

Another embodiment provides a photosensitive resin film fabricated by using the positive photosensitive resin composition.

A further embodiment provides a semiconductor device including the photosensitive resin film.

According to an embodiment, provided is a positive photosensitive resin composition that includes (A) an alkali soluble resin; (B) a novolac resin including a repeating unit represented by the following Chemical Formula 6; (C) a photosensitive diazoquinone compound; (D) a silane compound; and (E) a solvent.

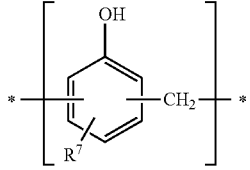

[Chemical Formula 6]

In Chemical Formula 6, $R^7$ is the same or different in each repeating unit and is each independently a substituted or unsubstituted C1 to C20 aliphatic organic group, wherein about 50 mol % or more, for example about 60 mol % or more, of $R^7$ is positioned at a meta position relative to a hydroxy group (OH) based on the total amount (100 mol %) of $R^7$ in the repeating unit included in the novolac resin.

About 90 mol % or more of $R^7$ may be positioned at a meta position and a para position relative to a hydroxy group (OH)

based on the total amount 100 mol % of $R^7$ in the repeating unit included in the novolac resin.

In the repeating unit included in the novolac resin, $R^7$ positioned at a meta position relative to a hydroxy group (OH) ($R^7_m$) and $R^7$ positioned at a para position relative to a hydroxy group (OH) ($R^7_p$) may be present at a mole ratio of about 5:5 to about 10:0, for example about 6:4 to about 9:1.

The novolac resin may further include a repeating unit represented by the following Chemical Formula 40.

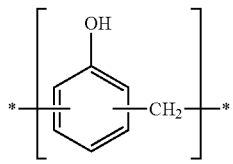

[Chemical Formula 40]

The novolac resin may include a repeating unit represented by the above Chemical Formula 6 and a repeating unit represented by the above Chemical Formula 40 at a mole ratio of about 30:70 to about 90:10.

The novolac resin may have a number average molecular weight (Mn) of about 1,000 g/mol to about 10,000 g/mol.

The alkali soluble resin may be a polybenzoxazole precursor.

The polybenzoxazole precursor may include a first polybenzoxazole precursor including a repeating unit represented by the following Chemical Formula 1, a repeating unit represented by the following Chemical Formula 2, or a combination thereof, and having a thermally polymerizable functional group at at least one terminal end of the first polybenzoxazole precursor; a second polybenzoxazole precursor including a repeating unit represented by the following Chemical Formula 4, a repeating unit represented by the following Chemical Formula 5, or a combination thereof; or a combination thereof.

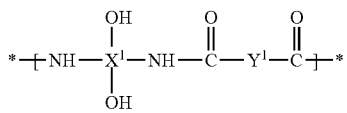

[Chemical Formula 1]

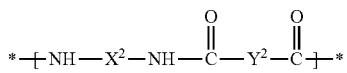

[Chemical Formula 2]

In Chemical Formulas 1 and 2, $X^1$ is the same or different in each repeating unit and is each independently a substituted or unsubstituted C6 to C30 aromatic organic group, a substituted or unsubstituted tetravalent to hexavalent C1 to C30 aliphatic organic group, or substituted or unsubstituted tetravalent to hexavalent C3 to C30 alicyclic organic group, $X^2$ is the same or different in each repeating unit and is each independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or a functional group represented by the following Chemical Formula 3, and $Y^1$ and $Y^2$ are the same or different in each repeating unit and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

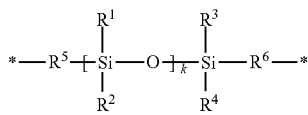

[Chemical Formula 3]

In Chemical Formula 3, $R^1$ to $R^4$ are the same or different and are each independently hydrogen, substituted or unsubstituted C1 to C30 alkyl, substituted or unsubstituted C6 to C30 aryl, substituted or unsubstituted C1 to C30 alkoxy, or hydroxy, $R^5$ and $R^6$ are the same or different and are each independently a single bond, substituted or unsubstituted C1 to C30 alkylene, or substituted or unsubstituted C6 to C30 arylene, and k is an integer ranging from 1 to 50.

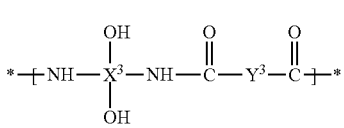

[Chemical Formula 4]

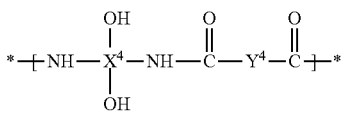

[Chemical Formula 5]

In Chemical Formulas 4 and 5, $X^3$ and $X^4$ are the same or different and are each independently a substituted or unsubstituted C6 to C30 aromatic organic group, a substituted or unsubstituted tetravalent to hexavalent C1 to C30 aliphatic organic group, or substituted or unsubstituted tetravalent to hexavalent C3 to C30 alicyclic organic group, $Y^3$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and includes a thermally polymerizable organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

The alkali soluble resin (A) may have a weight average molecular weight (Mw) of about 3,000 g/mol to about 50,000 g/mol.

The positive photosensitive resin composition may include about 1 parts by weight to about 50 parts by weight of the novolac resin (B); about 5 parts by weight to about 100 parts by weight of the photosensitive diazoquinone compound (C); about 0.1 parts by weight to about 30 parts by weight of the silane compound (D); and about 50 parts by weight to about 900 parts by weight of the solvent (E) based on about 100 parts by weight of the alkali soluble resin (A).

According to another embodiment, a photosensitive resin film fabricated by using the positive photosensitive resin composition is provided.

According to yet another embodiment, a semiconductor device including the photosensitive resin film is provided.

Further embodiments will be described in the detailed description.

The positive photosensitive resin composition can control dissolution rate of an exposed part and an unexposed part, and thus can improve sensitivity, developability, resolution, film residue ratio, and film shrinkage ratio characteristics due to the novolac resin having a predetermined structure.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" may refer to one substituted with at least a substituent including halogen (—F, —Cl, —Br, or —I), hydroxy, nitro, cyano, amino ($NH_2$, $NH(R^{200})$, or $N(R^{201})(R^{202})$, wherein $R^{200}$, $R^{201}$ and $R^{202}$ are the same or different and are each independently C1 to C10 alkyl), amidino, hydrazine, hydrazone, carboxyl, substituted or unsubstituted alkyl, substituted or unsubstituted alkenyl, substituted or unsubstituted alkynyl, substituted or unsubstituted alicyclic organic group, substituted or unsubstituted aryl, substituted or unsubstituted heterocyclic group, or a combination thereof.

As used herein, when a specific definition is not otherwise provided, the term "alkyl" may refer to C1 to C30 alkyl, for example C1 to C15 alkyl, the term "cycloalkyl" may refer to C3 to C30 cycloalkyl, for example C3 to C18 cycloalkyl, the term "alkoxy" may refer to C1 to C30 alkoxy, for example C1 to C18 alkoxy, the term "aryl" may refer to C6 to C30 aryl, for example C6 to C18 aryl, the term "alkenyl" may refer to C2 to C30 alkenyl, for example C2 to C18 alkenyl, the term "alkylene" may refer to C1 to C30 alkylene, for example C1 to C18 alkylene, and the term "arylene" may refer to C6 to C30 arylene, for example C6 to C16 arylene.

As used herein, when a specific definition is not otherwise provided, the term "aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" may refer to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, a C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" may refer to C6 to C30 aryl or C6 to C30 arylene, for example C6 to C16 aryl or C6 to C16 arylene, the term "heterocyclic group" may refer to C2 to C30 heterocyloalkyl, C2 to C30 heterocycloalkylene, C2 to C30 heterocycloalkenyl, C2 to C30 heterocycloalkenylene, C2 to C30 heterocycloalkynyl, C2 to C30 heterocycloalkynylene, C2 to C30 heteroaryl, or C2 to C30 heteroarylene that include 1 to 3 heteroatoms including O, S, N, P, Si, or a combination thereof in a ring, for example C2 to C15 heterocycloalkyl, C2 to C15 heterocycloalkylene, C2 to C15 heterocycloalkenyl, C2 to C15 heterocycloalkenylene, C2 to C15 heterocycloalkynyl, C2 to C15 heterocycloalkynylene, C2 to C15 heteroaryl, or C2 to C15 heteroarylene that include 1 to 3 heteroatoms including O, S, N, P, Si, or a combination thereof in a ring.

As used herein, when a specific definition is not otherwise provided, the term "combination" refers to mixing or copolymerization. Also, the term "copolymerization" refers to block copolymerization or random copolymerization, and the term "copolymer" refers to a block copolymer or a random copolymer.

Also, "*" refers to a linking part between the same or different atoms, or chemical formulas.

The positive photosensitive resin composition according to one embodiment includes (A) an alkali soluble resin; (B) a novolac resin including a repeating unit represented by the following Chemical Formula 6; (C) a photosensitive diazoquinone compound; (D) a silane compound; and (E) a solvent.

The positive photosensitive resin composition may further include an additional additive (F).

[Chemical Formula 6]

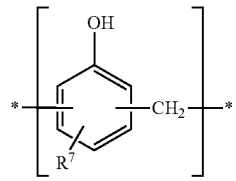

In Chemical Formula 6, $R^7$ is the same or different in each repeating unit and is each independently a substituted or unsubstituted C1 to C20 aliphatic organic group, for example substituted or unsubstituted C1 to C20 alkyl.

About 50 mol % or more of $R^7$ may be positioned at a meta position relative to a hydroxy group (OH) based on the total amount 100 mol % of $R^7$ in the repeating unit included in the novolac resin When the positive photosensitive resin composition includes the novolac resin as above described, in an unexposed part, the hydroxy group of the novolac resin forms a hydrogen bond with the alkali soluble resin and photosensitive diazoquinone compound and $R^7$ of the novolac resin has non-polarity. Thus, the unexposed part may not be easily dissolved by an alkali developing solution. On the other hand, the exposed part has polarity increased by a photosensitive diazoquinone compound, and thus, can be well dissolved in an alkali developing solution. In this way, since the unexposed part is controlled to be non-polar, and the exposed part is controlled to be polar, the exposed part may exhibit improved alkali developability and thus, sensitivity and a film residue ratio.

Non-polarity and polarity of the positive photosensitive resin composition may be identified by measuring a contact angle relative to water. Specifically, an unexposed part may have a contact angle relative to water in a range of about 65° to about 80°, and an exposed part may have a contact angle relative to water in a range of about 35° to about 60°.

Hereinafter, each composition component is described in detail.

(A) Alkali Soluble Resin

The alkali soluble resin may be a polybenzoxazole precursor.

For example, the polybenzoxazole precursor may include a first polybenzoxazole precursor including a repeating unit represented by the following Chemical Formula 1, a repeating unit represented by the following Chemical Formula 2, or a combination thereof, and including a thermally polymerizable functional group at least one terminal end of the first polybenzoxazole precursor; a second polybenzoxazole precursor including a repeating unit represented by the following Chemical Formula 4, a repeating unit represented by the following Chemical Formula 5, or a combination thereof; or a combination thereof, but is not limited thereto.

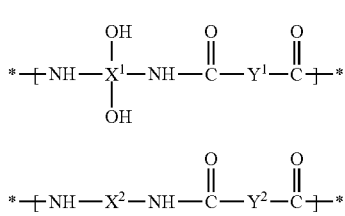

[Chemical Formula 1]

[Chemical Formula 2]

In Chemical Formulas 1 and 2, $X^1$ is the same or different in each repeating unit and is each independently a substituted or unsubstituted C6 to C30 aromatic organic group, a substituted or unsubstituted tetravalent to hexavalent C1 to C30 aliphatic organic group, or substituted or unsubstituted tetravalent to hexavalent C3 to C30 alicyclic organic group, $X^2$ is the same or different in each repeating unit and is each independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or a functional group represented by the following Chemical Formula 3, and $Y^1$ and $Y^2$ are the same or different in each repeating unit and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

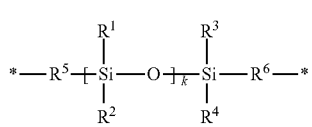

[Chemical Formula 3]

In Chemical Formula 3, $R^1$ to $R^4$ are the same or different and are each independently hydrogen, substituted or unsubstituted C1 to C30 alkyl, substituted or unsubstituted C6 to C30 aryl, substituted or unsubstituted C1 to C30 alkoxy, or hydroxy, $R^5$ and $R^6$ are the same or different and are each independently a single bond, substituted or unsubstituted C1 to C30 alkylene, or substituted or unsubstituted C6 to C30 arylene, and k is an integer ranging from 1 to 50.

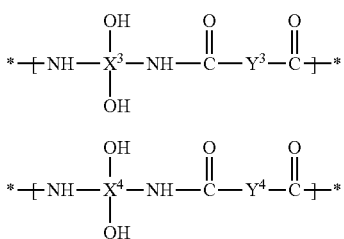

[Chemical Formula 4]

[Chemical Formula 5]

In Chemical Formulas 4 and 5, $X^3$ and $X^4$ are the same or different and are each independently a substituted or unsubstituted C6 to C30 aromatic organic group, a substituted or unsubstituted tetravalent to hexavalent C1 to C30 aliphatic organic group, or substituted or unsubstituted tetravalent to hexavalent C3 to C30 alicyclic organic group, $Y^3$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and includes a thermally polymerizable organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

The thermally polymerizable functional group and/or thermally polymerizable organic group included in the polybenzoxazole precursor may be cross-linked with the novolac resin during thermal curing and may improve mechanical strength of a film fabricated using a positive photosensitive resin composition and residue removal properties of the positive photosensitive resin composition.

As a result, the positive photosensitive resin composition may have excellent sensitivity, resolution, film residue ratios, pattern formation properties, and residue removal properties, and a photosensitive resin film fabricated using the positive photosensitive resin composition may have excellent mechanical properties.

In Chemical Formula 1, $X^1$ may be an aromatic organic group, an aliphatic organic group, or an alicyclic organic group. In one embodiment, $X^1$ may be an aromatic organic group or an alicyclic organic group.

In exemplary embodiments, $X^1$ may be a residual group derived from an aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl) hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl) hexafluoropropane, 2,2-bis(4-amino-3-hydroxy-6-trifluoromethylphenyl)hexafluoropropane, 2,2-bis(4-amino- 3-hydroxy-2-trifluoromethylphenyl)hexafluoropropane, 2,2-bis(3-amino-4-hydroxy-5-pentafluoroethylphenyl) hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane, 2-(3-amino-4-hydroxy-6-trifluoromethylphenyl)-2-(3-hydroxy-4-amino-5-trifluoromethylphenyl)hexafluoropropane, and the like, and combinations thereof.

$X^1$ may include a functional group represented by the following Chemical Formulas 7 and 8, but is not limited thereto.

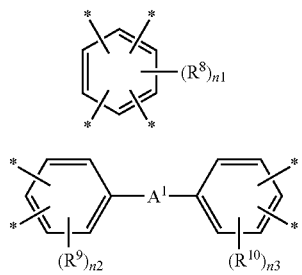

[Chemical Formula 7]

[Chemical Formula 8]

In Chemical Formulas 7 and 8,
$A^1$ is —O—, —CO—, —$CR^{203}R^{204}$—, —$SO_2$—, —S— or a single bond, wherein $R^{203}$ and $R^{204}$ are the same or different and are each independently hydrogen or substituted or unsubstituted alkyl, for example fluoroalkyl, $R^8$ to $R^{10}$ are the same or different and are each independently hydrogen, substituted or unsubstituted alkyl, substituted or unsubstituted carboxyl, hydroxy, or thiol, $n_1$ is an integer of 1 or 2, and $n_2$ and $n_3$ are the same or different and are each independently integers ranging from 1 to 3.

In Chemical Formula 2, $X^2$ is an aromatic organic group, a divalent to hexavalent aliphatic organic group, a divalent to hexavalent alicyclic organic group, or a functional group represented by the above Chemical Formula 3. For example, $X^2$ can be an aromatic organic group, a divalent to hexavalent alicyclic organic group, or a functional group represented by the above Chemical Formula 3.

In exemplary embodiments, $X^2$ is a residual group derived from aromatic diamine, alicyclic diamine, or silicon diamine.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, compounds having an alkyl group or a halogen substituted in an aromatic ring of the forgoing compounds, and the like, and combinations thereof.

Examples of the alicyclic diamine may include without limitation 1,4-diaminocyclohexane, 1,3-diaminocyclohexane, 1,2-diaminocyclohexane, 4,4'-methylenebiscyclohexylamine, 4,4'-methylenebis(2-methylcyclohexylamine), and the like, and combinations thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

Examples of $X^2$ may include functional groups represented by the following Chemical Formulas 9 to 12, but are not limited thereto.

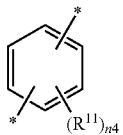

[Chemical Formula 9]

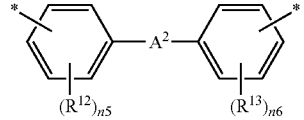

[Chemical Formula 10]

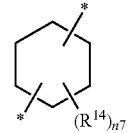

[Chemical Formula 11]

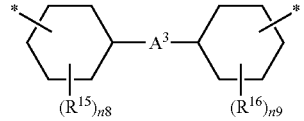

[Chemical Formula 12]

In Chemical Formulas 9 to 12,
$A^2$ and $A^3$ are the same or different and are independently —O—, —CO—, —$CR^{205}R^{206}$—, —$SO_2$—, —S—, or a single bond, wherein $R^{205}$ and $R^{206}$ are the same or different and are each independently hydrogen or substituted or unsubstituted alkyl, for example fluoroalkyl, $R^{11}$ to $R^{16}$ are the same or different and are each independently hydrogen, substituted or unsubstituted alkyl, substituted or unsubstituted carboxyl, hydroxy, or thiol, $n_4$, $n_5$ and $n_6$ are the same or different and are each independently integers ranging from 1 to 4, and $n_7$, $n_8$ and, $n_9$ are the same or different and are independently integers ranging from 1 to 10.

In Chemical Formulas 1 and 2, $Y^1$ and $Y^2$ are the same or different and are each independently an aromatic organic group, a divalent to hexavalent aliphatic organic group, or a divalent to hexavalent alicyclic organic group. For example, $Y^1$ and $Y^2$ are the same or different and are each independently an aromatic organic group or a divalent to hexavalent alicyclic organic group.

$Y^1$ and $Y^2$ may be a residual group derived from a dicarboxylic acid or a residual group derived from a dicarboxylic acid derivative.

Examples of the dicarboxylic acid include without limitation $Y^1(COOH)_2$ or $Y^2(COOH)_2$ (wherein $Y^1$ and $Y^2$ are the same as $Y^1$ and $Y^2$ of the above Chemical Formulas 1 and 2).

Examples of the dicarboxylic acid derivatives include without limitation carbonyl halide derivatives of $Y^1$ $(COOH)_2$, carbonyl halide derivatives of $Y^2(COOH)_2$, active compounds of an active ester derivative obtained by reacting $Y^1(COOH)_2$ and 1-hydroxy-1,2,3-benzotriazole, and the like, active compounds of an active ester derivative obtained by reacting $Y^2(COOH)_2$ with 1-hydroxy-1,2,3-benzotriazole, and the like (wherein $Y^1$ and $Y^2$ are the same as $Y^1$ and $Y^2$ of the above Chemical Formulas 1 and 2), and the like, and combinations thereof.

Examples of the dicarboxylic acid derivative include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

$Y^1$ and $Y^2$ may include functional groups represented by the following Chemical Formulas 13 to 15, but are not limited thereto.

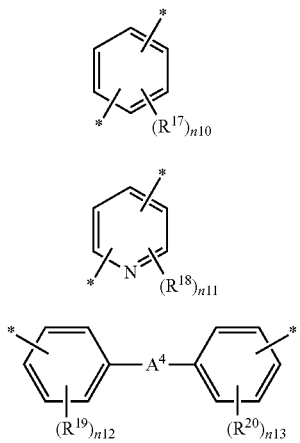

[Chemical Formula 13]

[Chemical Formula 14]

[Chemical Formula 15]

In Chemical Formulas 13 to 15, $R^{17}$ to $R^{20}$ are the same or different and are each independently hydrogen or substituted or unsubstituted alkyl, and $n_{10}$, $n_{12}$ and $n_{13}$ are the same or different and are each independently integers ranging from 1 to 4, $n_{11}$ is an integer ranging from 1 to 3, and $A^4$ is —O—, —$CR^{207}R^{208}$—, —CO—, —CONH—, —S—, —$SO_2$—, or a single bond, wherein $R^{207}$ and $R^{208}$ are the same or different and are each independently hydrogen or substituted or unsubstituted alkyl, for example fluoroalkyl.

The first polybenzoxazole precursor includes a thermally polymerizable functional group at least one terminal end of the first polybenzoxazole precursor. The thermally polymerizable organic group may form a bond with a hydroxy group included in the novolac resin in a subsequent process.

The thermally polymerizable organic group may be derived from an end-capping monomer. Examples of the end-capping monomers include without limitation monoamines, monoanhydrides, monocarboxylic acid halides including a carbon-carbon multiple bond, and the like, and combinations thereof.

Examples of the monoamines include without limitation toluidine, dimethylaniline, ethylaniline, aminophenol, aminobenzylalcohol, aminoindan, aminoacetophenone, and the like, and combinations thereof.

Examples of the monoanhydrides include without limitation 5-norbornene-2,3-dicarboxylic anhydride represented by the following Chemical Formula 16, 3,6-epoxy-1,2,3,6-tetrahydrophthalic anhydride represented by the following Chemical Formula 17, isobutenyl succinic anhydride represented by the following Chemical Formula 18, maleic anhydride, aconitic anhydride, 3,4,5,6-tetrahydrophthalic anhydride, cis-1,2,3,6-tetrahydrophthalic anhydride, itaconic anhydride (IA), citraconic anhydride (CA), 2,3-dimethylmaleic anhydride (DMMA), and the like, and combinations thereof.

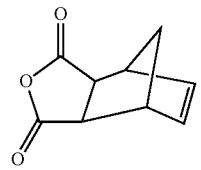

[Chemical Formula 16]

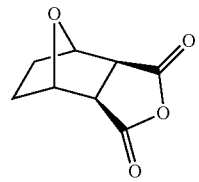

[Chemical Formula 17]

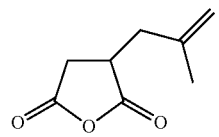

[Chemical Formula 18]

The thermally polymerizable functional group derived from the monoanhydrides may include a functional group represented by the following Chemical Formulas 19 to 23, but is not limited thereto. The thermally polymerizable functional group may be cross-linked during heating of the first polybenzoxazole precursor preparation process, and may be formed as a residual group at the terminal end of the first polybenzoxazole precursor.

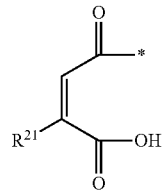

[Chemical Formula 19]

In Chemical Formula 19, $R^{21}$ is —H, —$CH_2COOH$ or —$CH_2CHCHCH_3$.

[Chemical Formula 20]

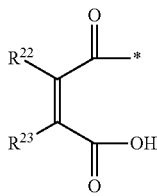

In Chemical Formula 20,
$R^{22}$ and $R^{23}$ are the same or different and are each independently —H or —$CH_3$.

[Chemical Formula 21]

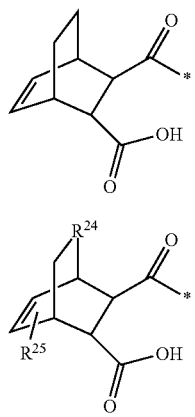

[Chemical Formula 22]

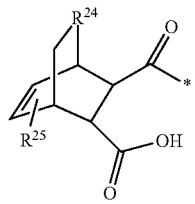

In Chemical Formula 22,
$R^{24}$ is —$CH_2$— or —O—, and $R^{25}$ is —H or —$CH_3$.

[Chemical Formula 23]

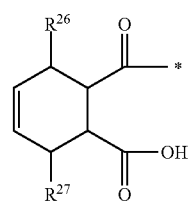

In Chemical Formula 23,
$R^{26}$ and $R^{27}$ are the same or different and are each independently, —H, —$CH_3$ or —$OCOCH_3$.

The monocarboxylic acid halides including the carbon-carbon multiple bonds may be represented by the following Chemical Formula 24.

[Chemical Formula 24]

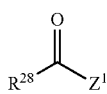

In Chemical Formula 24,
$R^{28}$ is a substituted or unsubstituted alicyclic organic group or substituted or unsubstituted aromatic organic group, wherein the substituted alicyclic organic group or substituted aromatic organic group is substituted with a substituent comprising a substituted or unsubstituted amidino group, a substituted or unsubstituted alicyclic organic group, or a fused ring of a substituted or unsubstituted alicyclic organic group with an aryl group, and the substituent of an alicyclic organic group may be a maleimide group, and
$Z^1$ is —F, —Cl, —Br or —I.

Examples of the monocarboxylic acid halides including a carbon-carbon multiple bond include without limitation 5-norbornene-2-carboxylic acid halide represented by the following Chemical Formula 25, 4-nadimido benzoylhalide represented by the following Chemical Formula 26, 4-(2-phenylmaleicimido)benzoylhalide represented by the following Chemical Formula 27, 4-(4-phenylethynylphthalimido) benzoylhalide represented by the following Chemical Formula 28, benzoylhalide represented by the following Chemical Formula 29, cyclobenzoylhalide represented by the following Chemical Formula 30, 4-(3-phenylethynylphthalimido)benzoylhalide, 4-maleimido benzoylhalide, and the like, and combinations thereof.

[Chemical Formula 25]

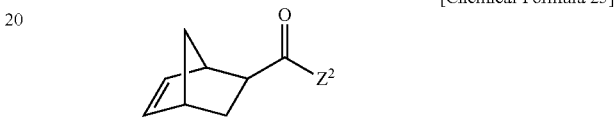

[Chemical Formula 26]

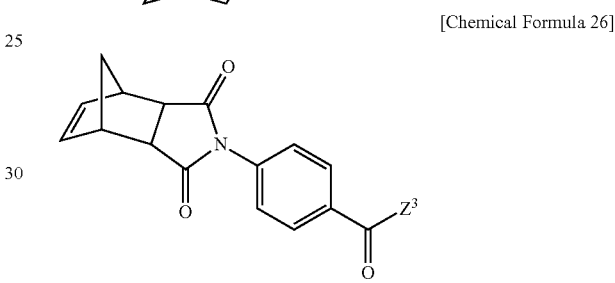

[Chemical Formula 27]

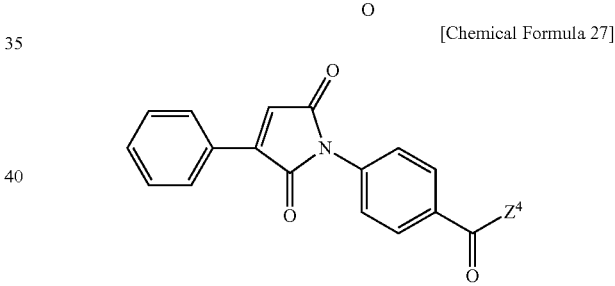

[Chemical Formula 28]

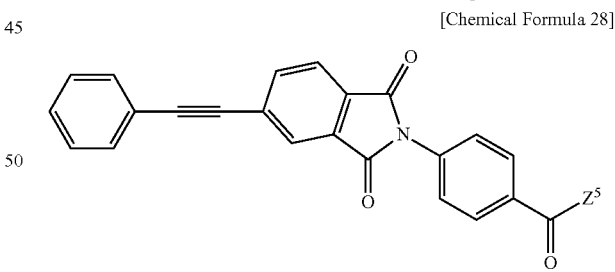

[Chemical Formula 29]

[Chemical Formula 30]

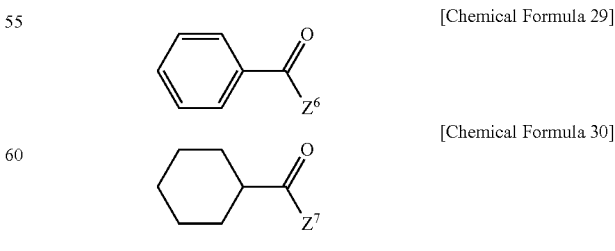

In Chemical Formulas 25 to 30,
$Z^2$ to $Z^7$ are the same or different and are each independently —F, —Cl, —Br, or —I.

In Chemical Formulas 4 and 5, $X^3$ and $X^4$ may be an aromatic organic group, an aliphatic organic group, or an alicyclic organic group. In one embodiment, $X^3$ and $X^4$ may be an aromatic organic group or an alicyclic organic group.

In exemplary embodiments, each $X^3$ and $X^4$ is a residual group derived from aromatic diamine.

Examples of the aromatic diamine and examples of $X^3$ and $X^4$ are the same as examples of aromatic diamine from which $X^1$ is derived and examples of $X^1$ described above.

In Chemical Formula 4, $Y^3$ is a thermally polymerizable organic group, and a residual group of a dicarboxylic acid derivative.

Examples of the dicarboxylic acid derivative may include without limitation carbonyl halide derivatives of $Y^3(COOH)_2$, active compounds of an active ester derivative obtained by reacting $Y^3(COOH)_2$ and 1-hydroxy-1,2,3-benzotriazole, and the like, and combinations thereof, and may include a carbon-carbon double bond capable of performing a thermal polymerization in its structure.

Also, a derivative of tetracarboxylic acid diester dicarboxylic acid obtained from an alcohol-addition decomposition reaction of tetracarboxylic acid dianhydride may be also used. That is to say, tetracarboxylic acid diester dicarboxylic acid obtained from an alcohol-addition decomposition reaction of tetracarboxylic acid dianhydride using an alcohol compound having a thermally polymerizable functional group may be used.

In exemplary embodiments, $Y^3$ may be a functional group represented by the following Chemical Formulas 31 to 33, but is not limited thereto.

[Chemical Formula 31]

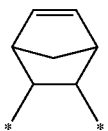

[Chemical Formula 32]

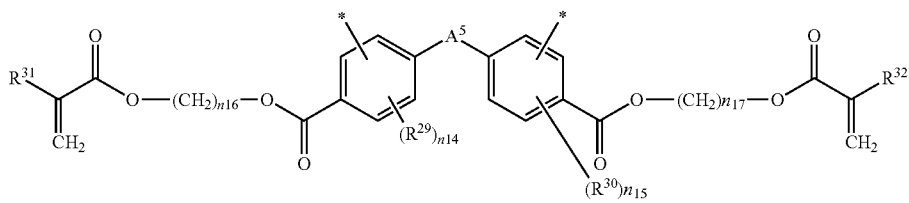

[Chemical Formula 33]

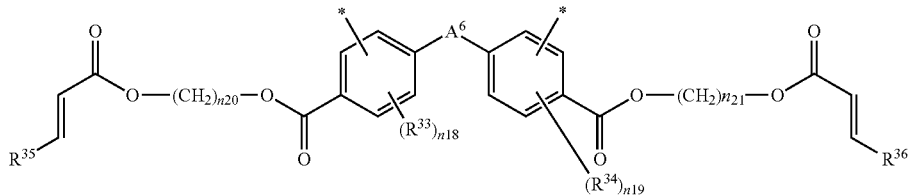

In Chemical Formulas 31 and 33, $R^{29}$ to $R^{36}$ are the same or different and are each independently hydrogen, substituted or unsubstituted C1 to C30 alkyl, or substituted or unsubstituted C6 to C30 aryl, $n_{14}$, $n_{15}$, $n_{18}$ and $n_{19}$ are the same or different and are each independently integers ranging from 1 to 4, $n_{16}$, $n_{17}$, $n_{20}$ and $n_{21}$ are the same or different and are each independently integers ranging from 2 to 20, and $A^5$ and $A^6$ are the same or different and are each independently —O—, —CO— or —SO$_2$—.

In exemplary embodiments, $Y^3$ may include functional groups represented by the following Chemical Formulas 34 to 39, but is not limited thereto.

[Chemical Formula 34]

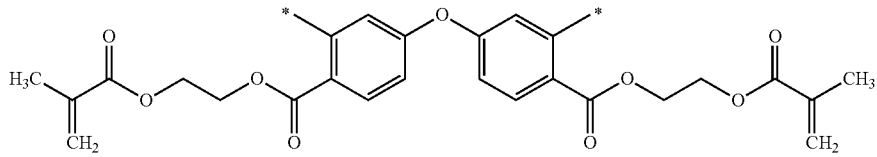

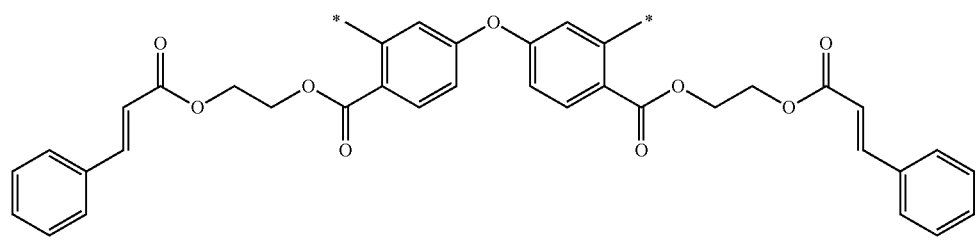

[Chemical Formula 35]

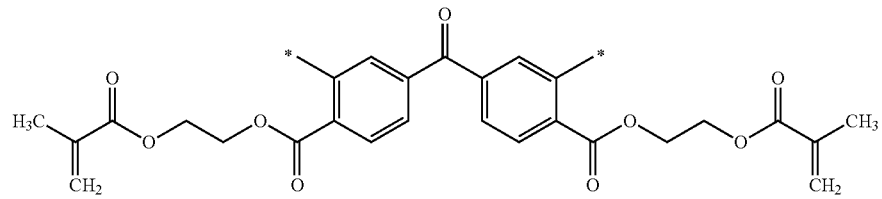

[Chemical Formula 36]

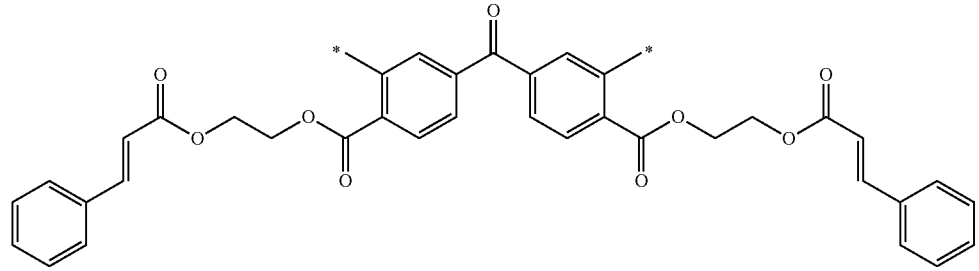

[Chemical Formula 37]

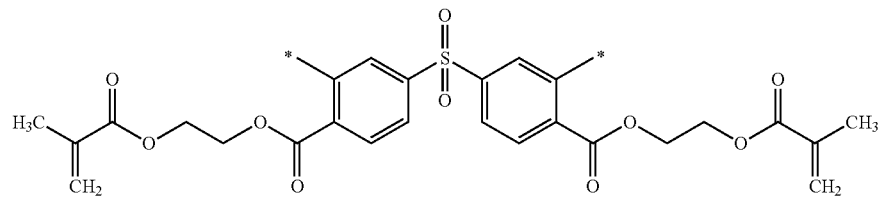

[Chemical Formula 38]

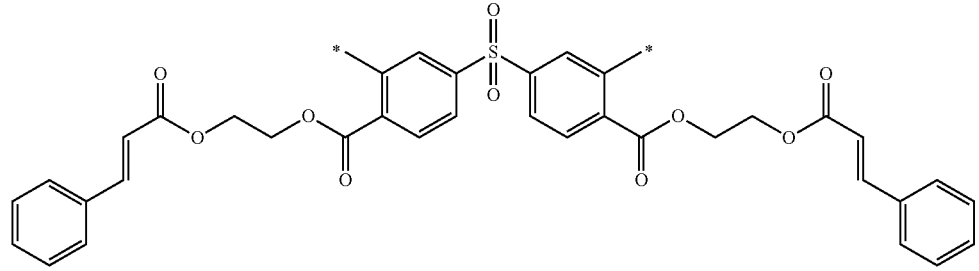

[Chemical Formula 39]

In Chemical Formula 5, $Y^4$ may be the same or different and each is independently an aromatic organic group, a divalent to hexavalent aliphatic organic group, or a divalent to hexavalent alicyclic organic group. In exemplary embodiments, $Y^4$ is the same or different and is each independently an aromatic organic group or a divalent to hexavalent alicyclic organic group.

$Y^4$ may be a residual group derived from a dicarboxylic acid or a residual group derived from a dicarboxylic acid derivative.

The dicarboxylic acid may be $Y^4(COOH)_2$ (wherein $Y^4$ is the same as $Y^4$ of the above Chemical Formula 5).

Examples of the dicarboxylic acid derivative may include without limitation carbonyl halide derivatives of $Y^4(COOH)_2$, active compounds of an active ester derivative obtained by reacting $Y^4(COOH)_2$ (wherein $Y^4$ is the same as $Y^4$ of the above Chemical Formula 5) and 1-hydroxy-1,2,3-benzotriazole, and the like, and combinations thereof.

Examples of the dicarboxylic acid derivative and examples of $Y^4$ are the same as examples of dicarboxylic acid derivative from which $Y^1$ and $Y^2$ are derived and examples of $Y^1$ and $Y^2$ described above.

When the alkali soluble resin includes the first polybenzoxazole precursor and the second polybenzoxazole precursor, the second polybenzoxazole precursor may be included in an amount of about 1 part by weight to about 30 parts by weight, for example about 5 parts by weight to about 20 parts by weight, based on about 100 parts by weight of the first polybenzoxazole precursor.

In some embodiments, the alkali soluble resin may include the second polybenzoxazole precursor in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the second polybenzoxazole precursor can be in a range from about any of the foregoing amounts to about any other of the foregoing amounts.

When the alkali soluble resin includes the second polybenzoxazole precursor in an amount within the above range, dissolution deterioration may be adjusted within an appropriate range and the film residue ratio of an unexposed part may not decrease, and thus resolution can be improved. Also cross-linking effects can be promoted and thus excellent mechanical properties of a cured film can be realized. In addition, including the second polybenzoxazole precursor in an amount within the above range may adjust the degree of cross-linking of a film after the curing within an appropriate range and thus can provide a cured film with excellent mechanical properties.

The alkali soluble resin may have a weight average molecular weight (Mw) of about 3,000 g/mol to about 50,000 g/mol, for example about 6,000 g/mol to about 30,000 g/mol. When the alkali soluble resin has a weight average molecular weight within the above range, sufficient properties and simultaneously sufficient dissolution property in an organic solvent may be secured, sufficient cross-linking can be provided, and thus mechanical properties of a film can be improved, and a residue after the development may not remain. In addition, the alkali soluble resin having a weight average molecular weight within the above range may prevent film thickness loss during development.

(B) Novolac Resin

A novolac resin includes a repeating unit represented by the above Chemical Formula 6 and may play a role of dissolution-controlling agent. The novolac resin may be formed of a random copolymer, a block copolymer, or a combination thereof, but is not limited thereto. For example, the novolac resin may be formed of a random copolymer.

In the positive photosensitive resin composition, about 60 mol % or more of $R^7$ may be positioned at a meta position relative to a hydroxy group (OH) based on the total amount 100 mol % of $R^7$ in the repeating unit included in the novolac resin.

In the positive photosensitive resin composition, about 90 mol % or more of $R^7$ may be positioned at a meta position and a para position relative to a hydroxy group (OH) based on the total amount 100 mol % of $R^7$ in the repeating unit included in the novolac resin. The repeating unit including $R^7$ positioned at a meta position relative to a hydroxy group (OH) ($R^7_m$) and the repeating unit including $R^7$ positioned at a para position relative to a hydroxy group (OH) ($R^7_p$) may be random polymerized or block polymerized, but is not limited thereto. In this case, $R^7$ positioned at a meta position ($R^7_m$) may improve the alkali developability and the sensitivity at the exposed part, and $R^7$ positioned at a para position ($R^7_p$) may suppress excess development at the exposed part and unexposed part to maintain an excellent film residue ratio. In this manner, the novolac resin may effectively control the alkali developability when using the positive photosensitive resin composition and improve the sensitivity and film residue ratio.

The novolac resin may include a repeating unit having $R^7$ positioned at a meta position relative to a hydroxy group (OH) ($R^7_m$) and a repeating unit having $R^7$ positioned at a para position relative to a hydroxy group (OH) ($R^7_p$) in a mole ratio of about 5:5 to about 10:0, for example about 6:4 to about 9:1. The repeating unit including $R^7$ positioned at a meta position relative to a hydroxy group (OH) ($R^7_m$) and the repeating unit including $R^7$ positioned at a para position relative to a hydroxy group (OH) ($R^7_p$) may be random polymerized or block polymerized, but is not limited thereto.

In some embodiments, the novolac resin may include a repeating unit represented by the above Chemical Formula 6 having $R^7$ positioned at a meta position relative to a hydroxy group (OH) ($R^7_m$) in an amount of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99 or 100 mole %. Further, according to some embodiments of the present invention, the amount of the repeating unit having $R^7_m$ can be in a range from about any of the foregoing amounts to about any other of the foregoing amounts.

In some embodiments, the novolac resin may include a repeating unit represented by the above Chemical Formula 6 having $R^7$ positioned at a para position relative to a hydroxy group (OH) ($R^7_p$) in an amount of zero (a repeating unit represented by the above Chemical Formula 6 having $R^7_p$ is not present), or about 0 (a repeating unit represented by the above Chemical Formula 6 having $R^7_p$ is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 mole %. Further, according to some embodiments of the present invention, the amount of the repeating unit having $R^7_p$ can be in a range from about any of the foregoing amounts to about any other of the foregoing amounts.

When the novolac resin includes a repeating unit having $R^7$ positioned at a meta position relative to a hydroxy group (OH) ($R^7_m$) and a repeating unit having $R^7$ positioned at a para position relative to a hydroxy group (OH) ($R^7_p$) in a mole ratio within the above range, alkali developability of the positive photosensitive resin composition may be effectively controlled and the positive photosensitive resin composition may exhibit improved sensitivity, film residue ratio, and heat resistance.

The novolac resin may further include a repeating unit represented by the following Chemical Formula 40.

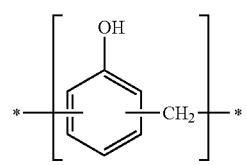

[Chemical Formula 40]

The novolac resin may include a compound including a repeating unit represented by above Chemical Formula 6 and a compound including a repeating unit represented by above Chemical Formula 40 in a weight ratio of about 30:70 to about 90:10.

The novolac resin may include a repeating unit represented by the above Chemical Formula 6 and a repeating unit represented by the above Chemical Formula 40 in a mole ratio of about 30:70 to about 90:10, for example about 40:60 to about 80:20.

In some embodiments, the novolac resin may include a repeating unit represented by the above Chemical Formula 6 in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 mole %. Further, according to some embodiments of the present invention, the amount of the novolac resin including a repeating unit represented by the above Chemical Formula 6 can be in a range from about any of the foregoing amounts to about any other of the foregoing amounts.

In some embodiments, the novolac resin may include a repeating unit represented by the above Chemical Formula 40 in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 mole %. Further, according to some embodiments of the present invention, the amount of the novolac resin including a repeating unit represented by the above Chemical Formula 40 can be in a range from about any of the foregoing amounts to about any other of the foregoing amounts.

When the novolac resin includes a cresol novolac repeating unit represented by above Chemical Formula 6 and a phenol novolac repeating unit represented by above Chemical Formula 40 in an amount within the above range, it may improve dissolubility in the alkali developing solution at the exposed part while suppressing dissolution at the unexposed part, so as to effectively improve the developability in the exposed part. Thereby it may improve film residue ratios, sensitivity, and pattern formation properties.

The novolac resin may have a number average molecular weight (Mn) of about 1,000 g/mol to about 10,000 g/mol.

The positive photosensitive resin composition may include the novolac resin in an amount of about 1 part by weight to about 50 parts by weight, for example about 1 part by weight to about 30 parts by weight, and as another example about 2 parts by weight to about 20 parts by weight, based on about 100 parts by weight of the alkali soluble resin. In some embodiments, the positive photosensitive resin composition may include the novolac resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 parts by weight. Further, according to some embodiments of the present invention, the amount of novolac resin can be in a range from about any of the foregoing amounts to about any other of the foregoing amounts.

When the positive photosensitive resin composition includes the novolac resin in an amount within the above range, it may effectively control the unexposed part with non-polarity and the exposed part with a polarity, so it may effectively improve the alkali developability in the exposed part.

(C) Photosensitive Diazoquinone Compound

The photosensitive diazoquinone compound may be a compound including a 1,2-benzoquinone diazide or 1,2-naphthoquinone diazide structure.

The photosensitive diazoquinone compound may include the compounds represented by the following Chemical Formulas 41, and 43 to 45, but is not limited thereto.

[Chemical Formula 41]

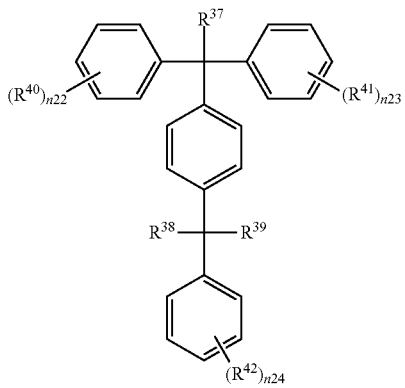

In Chemical Formula 41,
$R^{37}$ to $R^{39}$ are the same or different and are each independently hydrogen or substituted or unsubstituted C1 to C30 alkyl, for example —CH$_3$, $R^{40}$ to $R^{42}$ are the same or different and are each independently —OQ, wherein Q is hydrogen, a functional group represented by the following Chemical Formula 42a, or a functional group represented by the following Chemical Formula 42b, provided that all Qs are not simultaneously hydrogen, and $n_{22}$ to $n_{24}$ are the same or different and are independently integers ranging from 1 to 3.

[Chemical Formula 42a]

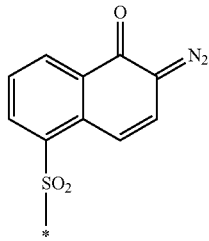

[Chemical Formula 42b]

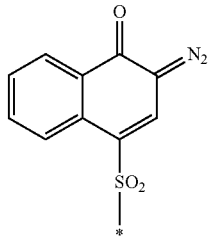

[Chemical Formula 43]

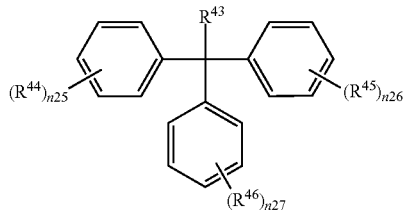

In Chemical Formula 43,
$R^{43}$ is hydrogen or substituted or unsubstituted C1 to C30 alkyl,
$R^{44}$ to $R^{46}$ are the same or different and are each independently —OQ, wherein Q is the same as defined in the above Chemical Formula 41, and
$n_{25}$ to $n_{27}$ are the same or different and are each independently integers ranging from 1 to 3.

[Chemical Formula 44]

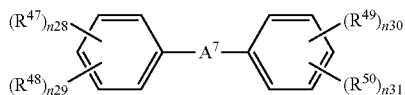

In Chemical Formula 44,
$A^7$ is —CO— or —CR$^{209}$R$^{210}$—, wherein R$^{209}$ and R$^{210}$ are the same or different and are each independently substituted or unsubstituted C1 to C30 alkyl,
$R^{47}$ to $R^{50}$ are the same or different and are each independently hydrogen, substituted or unsubstituted C1 to C30 alkyl, —OQ or —NHQ, wherein Q is the same as defined in Chemical Formula 41,
$n_{28}$ to $n_{31}$ are the same or different and are each independently integers ranging from 1 to 4, $n_{28}+n_{29}$ and $n_{30}+n_{31}$ the same or different and are are each independently integers of 5 or less, provided that at least one of $R^{47}$ and $R^{48}$ is —OQ, and one aromatic ring includes one to three —OQs and the other aromatic ring includes one to four —OQs.

[Chemical Formula 45]

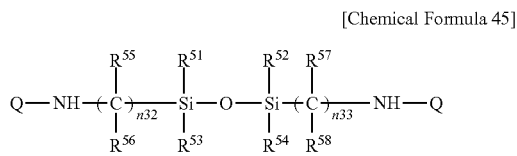

In Chemical Formula 45, $R^{51}$ to $R^{58}$ are the same or different and are each independently hydrogen or substituted or unsubstituted C1 to C30 alkyl, $n_{32}$ and $n_{33}$ are the same or different and are each independently integers ranging from 1 to 5, and Q is the same as defined in Chemical Formula 41.

The positive photosensitive resin composition may include the photosensitive diazoquinone compound in an amount of about 5 parts by weight to about 100 parts by weight based on about 100 parts by weight of the alkali soluble resin. In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the positive photosensitive resin composition includes the photosensitive diazoquinone compound in an amount within the above range, the pattern can be well-formed without a residue from exposure, and film thickness loss during development can be prevented and thereby a good pattern can be provided.

(D) Silane Compound

The silane compound improves adherence between the photosensitive resin composition and a substrate.

Examples of the silane compound may include without limitation compounds represented by the following Chemical Formulas 46 to 48; vinyltrimethoxysilane, vinyltriethoxysilane, vinyltrichlorosilane, vinyltris(β-methoxyethoxy)silane, 2-(3,4-epoxycyclohexyl)ethyltrimethoxysilane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane, trimethoxy[3-(phenylamino)propyl]silane, and the like, and combinations thereof.

[Chemical Formula 46]

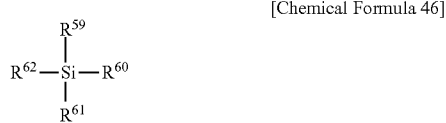

In Chemical Formula 46, $R^{59}$ is a vinyl group, substituted or unsubstituted alkyl, a substituted or unsubstituted alicyclic organic group, or substituted or unsubstituted aryl, for example 3-(meth)acryloxypropyl, p-styryl, 2-(3,4-epoxycyclohexyl)ethyl or 3-(phenylamino)propyl, $R^{60}$ to $R^{62}$ are the same or different and are each independently substituted or unsubstituted alkoxy, substituted or unsubstituted alkyl, or halogen, wherein at least one of $R^{60}$ to $R^{62}$ is alkoxy or halogen, for example the alkoxy may be C1 to C8 alkoxy, and alkyl may be C1 to C20 alkyl.

[Chemical Formula 47]

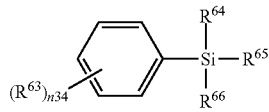

In Chemical Formula 47, $R^{63}$ is —$NH_2$ or —$NHCOCH_3$, $R^{64}$ to $R^{66}$ are the same or different and are each independently substituted or unsubstituted alkoxy, for example the alkoxy may be —$OCH_3$ or —$OCH_2CH_3$, and $n_{34}$ is an integer ranging from 1 to 5.

[Chemical Formula 48]

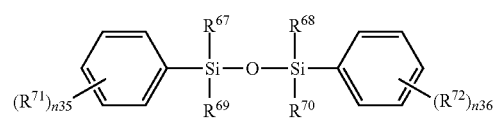

In Chemical Formula 48, $R^{67}$ to $R^{70}$ are the same or different and are each independently substituted or unsubstituted alkyl or substituted or unsubstituted alkoxy, and for example —$CH_3$ or —$OCH_3$, $R^{71}$ and $R^{72}$ are the same or different and are each independently substituted or unsubstituted amino, for example —$NH_2$ or —$NHCOCH_3$, and $n_{35}$ and $n_{36}$ are the same or different and are each independently integers ranging from 1 to 5.

The positive photosensitive resin composition may include the silane compound in an amount of about 0.1 parts by weight to about 30 parts by weight based on about 100 parts by weight of the alkali soluble resin. In some embodiments, the positive photosensitive resin composition may include the silane compound in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the silane compound can be in a range from about any of the foregoing amounts to about any other of the foregoing amounts.

When the positive photosensitive resin composition includes the silane compound in an amount within the above range, adherence between lower and upper layers can be sufficiently improved, residual film may not remain after development, and optical properties (transmittance) and mechanical properties such as tensile strength, elongation, and the like may be improved.

(E) Solvent

The solvent may be an organic solvent. Examples of the organic solvent may include without limitation N-methyl-2-pyrrolidone, gamma-butyrolactone, N,N-dimethylacetate, dimethylsulfoxide, diethyleneglycol dimethylether, diethyleneglycol diethylether, diethyleneglycol dibutylether, propyleneglycol monomethylether, dipropyleneglycol monomethylether, propyleneglycol monomethylether acetate, methyllactate, ethyllactate, butyllactate, methyl-1,3-butyleneglycol acetate, 1,3-butyleneglycol-3-monomethylether, methyl pyruvate, ethylpyruvate, methyl-3-methoxy propionate, and the like, and combinations thereof.

The positive photosensitive resin composition may include the solvent in an amount of about 50 parts by weight to about 900 parts by weight based on about 100 parts by weight of the alkali soluble resin. When the positive photosensitive resin composition includes the solvent in an amount within the above range, a sufficiently thick film can be obtained, and good solubility and coating can be provided.

(F) Other Additive

The positive photosensitive resin composition according to one embodiment may further include one or more other additives (F).

A non-limiting example of an additive includes a latent thermal acid generator. Examples of the latent thermal acid generator include without limitation arylsulfonic acids such as p-toluenesulfonic acid, benzenesulfonic acid, and the like; perfluoroalkylsulfonic acids such as trifluoromethanesulfonic acid, trifluorobutanesulfonic acid, and the like; alkylsulfonic acids such as methanesulfonic acid, ethanesulfonic acid, butanesulfonic acid, and the like; and the like, and combinations thereof.

The latent thermal acid generator is a catalyst for a dehydration reaction and a cyclization reaction of a polyamide including a phenolic hydroxy group of the polybenzoxazole precursor, and thus a cyclization reaction may be performed smoothly even if a curing temperature is decreased.

In addition, the positive photosensitive resin composition may further include an additive such as a suitable surfactant or leveling agent to prevent a stain of the film or to improve the development.

An exemplary process for forming a pattern using a positive photosensitive resin composition includes: coating a positive photosensitive resin composition on a supporting substrate; drying the coated positive photosensitive resin composition to provide a positive photosensitive resin composition film; exposing the positive photosensitive resin composition film; developing the positive photosensitive resin composition film using an alkali aqueous solution to provide a photosensitive resin film; and heating the photosensitive resin film. The conditions of processes to provide a pattern are widely known in this art, so detailed descriptions thereof will be omitted in this specification.

According to another embodiment, a photosensitive resin film fabricated using the positive photosensitive resin composition is provided. The photosensitive resin film may be an insulation layer or a protective layer.

According to yet another embodiment, a semiconductor device including the photosensitive resin film is provided.

The positive photosensitive resin composition may be applicable for forming an insulation layer, a passivation layer, or a buffer coating layer of a semiconductor device. That is to say, the positive photosensitive resin composition may be applicable for forming a surface protective layer and an interlayer insulating layer of a semiconductor device.

EXAMPLES

The following examples illustrate the present invention in more detail. However, it is understood that the present invention is not limited by these examples.

Synthesis Example 1

Synthesis of Polybenzoxazole Precursor (PBO-1)

17.4 g of 2,2-bis(3-amino-4-hydroxyphenyl)-1,1,1,3,3,3-hexafluoro propane and 0.86 g of 1,3-bis(aminopropyl)tetramethyldisiloxane are introduced into a four-neck flask mounted with an agitator, a temperature controller, a nitrogen gas injector, and a cooler while nitrogen is passed therethrough and added with 280 g of N-methyl-2-pyrrolidone (NMP) and dissolved. The solution has a solid content of 9 wt %.

When the solid is completely dissolved, 9.9 g of pyridine is introduced thereto. Then a solution including 13.3 g of 4,4'-oxydibenzoyl chloride added and dissolved into 142 g of N-methyl-2-pyrrolidone (NMP) is slowly added thereto in a dropwise fashion for 30 minutes while maintaining the temperature at 0° C. to 5° C. Thereafter the resulting mixture is reacted for one hour at a temperature of 0° C. to 5° C. and then heated to room temperature (25° C.) and reacted for one hour.

1.6 g of 5-norbornene-2,3-dicarboxylic anhydride is introduced thereto and agitated at 70° C. for 24 hours to complete the reaction. The reaction mixture is introduced into a solution of water/methanol=10/1 (volume ratio) to provide a precipitate, and the precipitate is filtered and fully cleaned with water and dried at a temperature of 80° C. under the vacuum for 24 hours or longer to provide a polybenzoxazole precursor (PBO-1).

Synthesis Example 2

Synthesis of Polybenzoxazole Precursor (PBO-2)

A polybenzoxazole precursor (PBO-2) is prepared in accordance with the same procedure as in Synthesis Example 1, except that maleic anhydride is used instead of 5-norbornene-2,3-dicarboxylic anhydride.

Synthesis Example 3

Synthesis of Polybenzoxazole Precursor (PBO-3)

A polybenzoxazole precursor (PBO-3) is prepared in accordance with the same procedure as in Synthesis Example 1, except that aconitic anhydride is used instead of 5-norbornene-2,3-dicarboxylic anhydride.

Synthesis Example 4

Synthesis of Polybenzoxazole Precursor (PBO-4)

A polybenzoxazole precursor (PBO-4) is prepared in accordance with the same procedure as in Synthesis Example 1, except that isobutenyl succinic anhydride is used instead of 5-norbornene-2,3-dicarboxylic anhydride.

Synthesis Example 5

Synthesis of Polybenzoxazole Precursor (PBO-5)

A polybenzoxazole precursor (PBO-5) is prepared in accordance with the same procedure as in Synthesis Example 1, except that 3,6-epoxy-1,2,3,6-tetrahydrophthalic anhydride is used instead of 5-norbornene-2,3-dicarboxylic anhydride.

Example 1

Preparation of Positive Photosensitive Resin Composition 15 g of polybenzoxazole precursor (PBO-1) obtained from Synthesis Example 1 is added and dissolved in 35.0 g of gamma-butyrolactone (GBL). 2.25 g of compound having a 6:4 ratio of a meta cresol novolac repeating unit and a para cresol novolac repeating unit and having a number average molecular weight of 4,000 as a novolac resin including a repeating unit represented by the following Chemical Formula 49, 2.25 g of photosensitive diazoquinone compound represented by the following Chemical Formula 50, and 0.75 g of 2-(3,4-epoxycyclohexyl)ethyltrimethoxysilane represented by the following Chemical Formula 51 are introduced thereto and dissolved and filtered by a 0.45 μm fluororesin filter to provide a positive photosensitive resin composition.

[Chemical Formula 49]

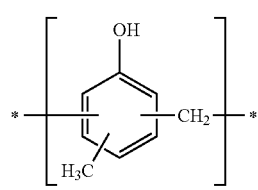

[Chemical Formula 50]

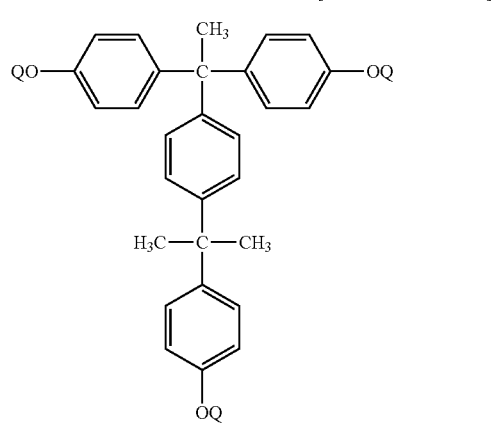

In Chemical Formula 50,

Q is the same as defined in the above Chemical Formula 41, about 67% (⅔) of the Q is the group represented by the following Chemical Formula 42b.

[Chemical Formula 42b]

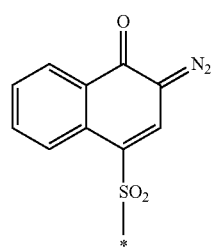

[Chemical Formula 51]

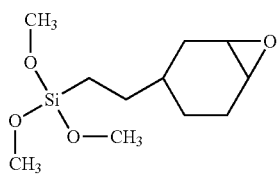

Examples 2 to 4

Preparation of Positive Photosensitive Resin Composition

A positive photosensitive resin composition is prepared in accordance with the same procedure as in Example 1, except that the novolac resin shown in the following Table 1 is used.

Example 5

Preparation of Positive Photosensitive Resin Composition 15 g of polybenzoxazole precursor (PBO-1) obtained from Synthesis Example 1 is added and dissolved in 35.0 g of gamma-butyrolactone (GBL). 2.25 g of compound having a 6:4 ratio of a meta cresol novolac repeating unit and a para cresol novolac repeating unit and having a number average molecular weight of 7,000 as a novolac resin including a repeating unit represented by the above Chemical Formula 49, 0.75 g of novolac resin including a repeating unit represented by the following Chemical Formula 40 and having a number average molecular weight of 5,000, 2.25 g of photosensitive diazoquinone compound represented by the above Chemical Formula 50, and 0.75 g of 2-(3,4-epoxycyclohexyl) ethyltrimethoxysilane represented by the above Chemical Formula 51 are introduced thereto and dissolved and filtered by a 0.45 μm fluororesin filter to provide a positive photosensitive resin composition.

[Chemical Formula 40]

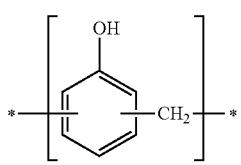

Examples 6 to 8

Preparation of Positive Photosensitive Resin Composition

A positive photosensitive resin composition is prepared in accordance with the same procedure as in Example 5, except that the novolac resin shown in the following Table 1 is used.

Examples 9 to 40

Preparation of Positive Photosensitive Resin Composition

A positive photosensitive resin composition is prepared in accordance with the same procedure as in Example 1 or Example 5, except that the polybenzoxazole precursor and the novolac resin shown in the following Table 1 are used.

Comparative Example 1

Preparation of Positive Photosensitive Resin Composition 15 g of polybenzoxazole precursor (PBO-1) obtained from Synthesis Example 1 is added and dissolved in 35.0 g of gamma-butyrolactone (GBL). 2.25 g of compound having a 2:8 ratio of a meta cresol novolac repeating unit and a para cresol novolac repeating unit and having a number average molecular weight of 4,000 as a novolac resin including a repeating unit represented by the above Chemical Formula 49, 2.25 g of photosensitive diazoquinone compound represented by the above Chemical Formula 50, and 0.75 g of 2-(3,4-epoxycyclohexyl)ethyltrimethoxysilane represented by the following Chemical Formula 51 are introduced thereto and dissolved and filtered by a 0.45 μm fluororesin filter to provide a positive photosensitive resin composition.

Comparative Example 2 and 3

Preparation of Positive Photosensitive Resin Composition

A positive photosensitive resin composition is prepared in accordance with the same procedure as in Comparative Example 1, except that the novolac resin shown in the following Table 1 is used.

Comparative Example 4

Preparation of Positive Photosensitive Resin Composition

A positive photosensitive resin composition is prepared in accordance with the same procedure as in Comparative Example 1, except that 0.75 g of hydroxyl phenol compound represented by the following Chemical Formula 52 is used instead of 2.25 g of compound having a 2:8 ratio of meta cresol novolac repeating unit and para cresol novolac repeating unit and having a number average molecular weight of 4,000 as a novolac resin including a repeating unit represented by the above Chemical Formula 49.

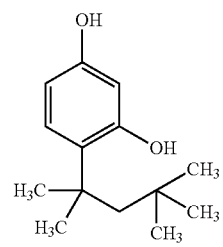

[Chemical Formula 52]

Comparative Examples 5 to 20

Preparation of Positive Photosensitive Resin Composition

A positive photosensitive resin composition is prepared in accordance with the same procedure as in Comparative Example 1 or Comparative Example 4, except that the polybenzoxazole precursor, the novolac resin, and the hydroxy phenol compound shown in the following Table 1 are used.

TABLE 1

| | Polybenzoxazole precursor (g) | Novolac resin | | | | | Hydroxy phenol compound (Chemical Formula 52) Amount (g) |
|---|---|---|---|---|---|---|---|
| | | Cresol novolac (Chemical Formula 49) | | | Phenol novolac (Chemical Formula 40) | | |
| | | meta:para (mole ratio) | Number average molecular weight (Mn) | Amount (g) | Number average molecular weight (Mn) | Amount (g) | |
| Example 1 | PBO-1 | 6:4 | 4,000 | 2.25 | — | — | — |
| Example 2 | 15 g | 7:3 | 4,000 | 2.25 | — | — | — |
| Example 3 | | 8:2 | 4,000 | 2.25 | — | — | — |
| Example 4 | | 9:1 | 4,000 | 2.25 | — | — | — |
| Example 5 | | 6:4 | 7,000 | 2.25 | 5,000 | 0.75 | — |
| Example 6 | | 7:3 | 7,000 | 2.25 | 5,000 | 0.75 | — |
| Example 7 | | 8:2 | 7,000 | 2.25 | 5,000 | 0.75 | — |
| Example 8 | | 9:1 | 7,000 | 2.25 | 5,000 | 0.75 | — |
| Comparative Example 1 | | 2:8 | 4,000 | 2.25 | — | — | — |
| Comparative Example 2 | | 2:8 | 4,000 | 2.25 | 5,000 | 0.75 | — |
| Comparative Example 3 | | — | — | — | 5,000 | 0.75 | — |
| Comparative Example 4 | | — | — | — | — | — | 0.75 |
| Example 9 | PBO-2 | 6:4 | 4,000 | 2.25 | — | — | — |
| Example 10 | 15 g | 7:3 | 4,000 | 2.25 | — | — | — |
| Example 11 | | 8:2 | 4,000 | 2.25 | — | — | — |
| Example 12 | | 9:1 | 4,000 | 2.25 | — | — | — |
| Example 13 | | 6:4 | 7,000 | 2.25 | 5,000 | 0.75 | — |

TABLE 1-continued

| | | Novolac resin | | | | | |
| | | Cresol novolac (Chemical Formula 49) | | | Phenol novolac (Chemical Formula 40) | | Hydroxy phenol compound (Chemical Formula 52) |
| | Polybenzoxazole precursor (g) | meta:para (mole ratio) | Number average molecular weight (Mn) | Amount (g) | Number average molecular weight (Mn) | Amount (g) | Amount (g) |
|---|---|---|---|---|---|---|---|
| Example 14 | | 7:3 | 7,000 | 2.25 | 5,000 | 0.75 | — |
| Example 15 | | 8:2 | 7,000 | 2.25 | 5,000 | 0.75 | — |
| Example 16 | | 9:1 | 7,000 | 2.25 | 5,000 | 0.75 | — |
| Comparative Example 5 | | 2:8 | 4,000 | 2.25 | — | — | — |
| Comparative Example 6 | | 2:8 | 4,000 | 2.25 | 5,000 | 0.75 | — |
| Comparative Example 7 | | — | — | — | 5,000 | 0.75 | — |
| Comparative Example 8 | | — | — | — | — | — | 0.75 |
| Example 17 | PBO-3 | 6:4 | 4,000 | 2.25 | — | — | — |
| Example 18 | 15 g | 7:3 | 4,000 | 2.25 | — | — | — |
| Example 19 | | 8:2 | 4,000 | 2.25 | — | — | — |
| Example 20 | | 9:1 | 4,000 | 2.25 | — | — | — |
| Example 21 | | 6:4 | 7,000 | 2.25 | 5,000 | 0.75 | — |
| Example 22 | | 7:3 | 7,000 | 2.25 | 5,000 | 0.75 | — |
| Example 23 | | 8:2 | 7,000 | 2.25 | 5,000 | 0.75 | — |
| Example 24 | | 9:1 | 7,000 | 2.25 | 5,000 | 0.75 | — |
| Comparative Example 9 | | 2:8 | 4,000 | 2.25 | — | — | — |
| Comparative Example 10 | | 2:8 | 4,000 | 2.25 | 5,000 | 0.75 | — |
| Comparative Example 11 | | — | — | — | 5,000 | 0.75 | — |
| Comparative Example 12 | | — | — | — | — | — | 0.75 |
| Example 25 | PBO-4 | 6:4 | 4,000 | 2.25 | — | — | — |
| Example 26 | 15 g | 7:3 | 4,000 | 2.25 | — | — | — |
| Example 27 | | 8:2 | 4,000 | 2.25 | — | — | — |
| Example 28 | | 9:1 | 4,000 | 2.25 | — | — | — |
| Example 29 | | 6:4 | 7,000 | 2.25 | 5,000 | 0.75 | — |
| Example 30 | | 7:3 | 7,000 | 2.25 | 5,000 | 0.75 | — |
| Example 31 | | 8:2 | 7,000 | 2.25 | 5,000 | 0.75 | — |
| Example 32 | | 9:1 | 7,000 | 2.25 | 5,000 | 0.75 | — |
| Comparative Example 13 | | 2:8 | 4,000 | 2.25 | — | — | — |
| Comparative Example 14 | | 2:8 | 4,000 | 2.25 | 5,000 | 0.75 | — |
| Comparative Example 15 | | — | — | — | 5,000 | 0.75 | — |
| Comparative Example 16 | | — | — | — | — | — | 0.75 |
| Example 33 | PBO-5 | 6:4 | 4,000 | 2.25 | — | — | — |
| Example 34 | 15 g | 7:3 | 4,000 | 2.25 | — | — | — |
| Example 35 | | 8:2 | 4,000 | 2.25 | — | — | — |
| Example 36 | | 9:1 | 4,000 | 2.25 | — | — | — |
| Example 37 | | 6:4 | 7,000 | 2.25 | 5,000 | 0.75 | — |
| Example 38 | | 7:3 | 7,000 | 2.25 | 5,000 | 0.75 | — |
| Example 39 | | 8:2 | 7,000 | 2.25 | 5,000 | 0.75 | — |
| Example 40 | | 9:1 | 7,000 | 2.25 | 5,000 | 0.75 | — |
| Comparative Example 17 | | 2:8 | 4,000 | 2.25 | — | — | — |
| Comparative Example 18 | | 2:8 | 4,000 | 2.25 | 5,000 | 0.75 | — |
| Comparative Example 19 | | — | — | — | 5,000 | 0.75 | — |
| Comparative Example 20 | | — | — | — | — | — | 0.75 |

Experimental Example 1

Sensitivity and Film Residue Ratios

Each positive photosensitive resin composition prepared from Examples 1 to 40 and Comparative Examples 1 to 20 is coated on a 8-inch wafer using a spin coater manufactured by Mikasa (1H-DX2), and then heated on a hot plate to 130° C. for 2 minutes to provide a polybenzoxazole precursor film.

The polybenzoxazole precursor films are exposed through a mask having various sized patterns by an I-line stepper (NSR i10C) manufactured by Japan Nikon for 250 ms, and the exposed part is dissolved and removed in a 2.38 wt % tetramethylammonium hydroxide (TMAH) aqueous solution at room temperature for 40 seconds, 2 puddles, and washed with pure water for 30 seconds. Subsequently, the obtained pattern is cured in an electric furnace under an oxygen concentration of 1000 ppm or below at 150° C. for 30 minutes and additionally at 320° C. for 30 minutes to provide a patterned film.

Optimal exposure time is measured to determine sensitivity by measuring the exposure time required to obtain a 10 μm L/S pattern with a 1:1 line width after exposure and development. The results are shown in the following Table 2.

In general, a film should have a small decrease in film thickness during development, since film thickness decrease rate during development can influence developability and final film thickness. In order to measure the same, the prebaked film is developed by dipping the same in 2.38 wt % of tetramethylammonium hydroxide (TMAH) aqueous solution and washing with water, and the film thickness variation is measured according to time to calculate a film residue ratio (thickness after development/thickness before development, unit %). The results are shown in the following Table 2. The thickness variation after prebaking, development, and curing are measured by KMAC-manufactured (ST4000-DLX) equipment.

Experimental Example 2

Measurement of Contact Angle

Each positive photosensitive resin composition prepared from Examples 1 to 40 and Comparative Examples 1 to 20 is coated on a 8-inch wafer by a spin coater manufactured by Mikasa (1H-DX2) and then heated on a hot plate to 120° C. for 4 minutes to provide a polybenzoxazole precursor film.

The polybenzoxazole precursor films are exposed through a mask having various sized patterns by an I-line stepper (NSR i10C) manufactured by Japan Nikon for 250 ms, and the exposed part is dissolved and removed in a 2.38 wt % tetramethylammonium hydroxide (TMAH) aqueous solution at room temperature for 40 seconds, 2 puddles, and washed with pure water for 30 seconds.

The contact angle is measured according to Target method 1 by KRUSS-manufactured DAS-100 contact angle analyzer. The silicon wafer is baked on a hot plate at 100° C. for 10 minutes to remove surface moisture and cooled for 2 minutes at room temperature. Then the silicon wafer is positioned on the stage of a contact angle analyzer, 3 μL of water are dropped thereon, and the contact angle of the water drop is measured for 10 seconds after 3 seconds. The surface shape change of the liquid is tracked depending on time and is measured 50 times for 10 seconds at 17 points in total. The average of the measurements is calculated in accordance with the 'dynamic' method. The results are shown in the following Table 2.

TABLE 2

| | Sensitivity (mJ/cm$^2$) | Film residue ratios (%) | Contact angle of unexposed part (degree) | Contact angle of exposed part (degree) |
|---|---|---|---|---|
| Example 1 | 410 | 94 | 74 | 54 |
| Example 2 | 290 | 92 | 76 | 52 |
| Example 3 | 240 | 93 | 72 | 52 |
| Example 4 | 190 | 93 | 75 | 51 |
| Example 5 | 390 | 90 | 68 | 49 |
| Example 6 | 230 | 88 | 69 | 47 |
| Example 7 | 200 | 89 | 70 | 45 |
| Example 8 | 140 | 90 | 71 | 40 |
| Comparative Example 1 | 780 | 96 | 78 | 71 |
| Comparative Example 2 | 690 | 91 | 74 | 66 |
| Comparative Example 3 | 600 | 85 | 58 | 42 |
| Comparative Example 4 | 600 | 86 | 49 | 48 |
| Example 9 | 550 | 93 | 65 | 50 |
| Example 10 | 500 | 92 | 66 | 52 |
| Example 11 | 400 | 93 | 68 | 56 |
| Example 12 | 380 | 92 | 69 | 53 |
| Example 13 | 410 | 91 | 65 | 48 |
| Example 14 | 380 | 91 | 65 | 46 |
| Example 15 | 330 | 90 | 66 | 48 |
| Example 16 | 280 | 92 | 68 | 51 |
| Comparative Example 5 | 830 | 94 | 75 | 75 |
| Comparative Example 6 | 750 | 91 | 76 | 68 |
| Comparative Example 7 | 700 | 89 | 60 | 45 |
| Comparative Example 8 | 680 | 87 | 53 | 50 |
| Example 17 | 550 | 93 | 74 | 57 |
| Example 18 | 500 | 91 | 76 | 56 |
| Example 19 | 400 | 90 | 72 | 56 |
| Example 20 | 380 | 90 | 68 | 55 |
| Example 21 | 350 | 91 | 69 | 46 |
| Example 22 | 280 | 92 | 68 | 45 |
| Example 23 | 230 | 93 | 67 | 42 |
| Example 24 | 180 | 92 | 67 | 43 |
| Comparative Example 9 | 770 | 91 | 74 | 69 |
| Comparative Example 10 | 700 | 90 | 70 | 60 |
| Comparative Example 11 | 650 | 90 | 55 | 40 |
| Comparative Example 12 | 650 | 86 | 52 | 41 |
| Example 25 | 610 | 93 | 74 | 57 |
| Example 26 | 530 | 91 | 76 | 56 |
| Example 27 | 450 | 93 | 72 | 59 |
| Example 28 | 380 | 92 | 74 | 58 |
| Example 29 | 410 | 90 | 70 | 49 |
| Example 30 | 370 | 89 | 70 | 50 |
| Example 31 | 320 | 89 | 69 | 51 |
| Example 32 | 250 | 90 | 69 | 51 |
| Comparative Example 13 | 800 | 91 | 56 | 72 |
| Comparative Example 14 | 720 | 93 | 74 | 55 |
| Comparative Example 15 | 600 | 91 | 58 | 47 |
| Comparative Example 16 | 590 | 88 | 54 | 46 |
| Example 33 | 430 | 93 | 76 | 54 |
| Example 34 | 340 | 93 | 76 | 53 |
| Example 35 | 260 | 92 | 72 | 53 |
| Example 36 | 180 | 93 | 77 | 52 |
| Example 37 | 360 | 89 | 66 | 43 |
| Example 38 | 270 | 88 | 72 | 40 |
| Example 39 | 200 | 88 | 65 | 41 |
| Example 40 | 180 | 87 | 76 | 39 |

TABLE 2-continued

| | Sensitivity (mJ/cm$^2$) | Film residue ratios (%) | Contact angle of unexposed part (degree) | Contact angle of exposed part (degree) |
|---|---|---|---|---|
| Comparative Example 17 | 720 | 93 | 71 | 70 |
| Comparative Example 18 | 630 | 91 | 72 | 62 |
| Comparative Example 19 | 560 | 87 | 53 | 48 |
| Comparative Example 20 | 520 | 85 | 51 | 43 |

As shown in Table 2, the positive photosensitive resin compositions of Examples 1 to 40 have both excellent sensitivity and film residue ratios.

In contrast, the positive photosensitive resin compositions of Comparative Examples 1 to 20 have a film residue ratio comparable to that of Examples 1 to 20, but have significantly inferior sensitivity characteristics.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition, comprising:
   (A) an alkali soluble resin, wherein the alkali soluble resin (A) is not a novolac resin;
   (B) about 1 parts by weight to about 50 parts by weight of a novolac resin including a repeating unit represented by the following Chemical Formula 6;
   (C) about 5 parts by weight to about 100 parts by weight of a photosensitive diazoquinone compound;
   (D) about 0.1 parts by weight to about 30 parts by weight of a silane compound; and
   (E) about 50 parts by weight to about 900 pars by weight of a solvent, each based on about 100 parts by weight of the alkali soluble resin (A):

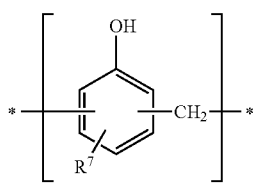

[Chemical Formula 6]

wherein, in Chemical Formula 6,
R$^7$ is the same or different in each repeating unit and is each independently a substituted or unsubstituted C1 to C20 aliphatic organic group, wherein about 70 mol % or more of R$^7$ is positioned at a meta position relative to a hydroxy group (OH) based on the total amount 100 mol % of R$^7$ in the repeating unit included in the novolac resin.

2. The positive photosensitive resin composition of claim 1, wherein about 90 mol % or more of R$^7$ is positioned at a meta position and a para position relative to a hydroxy group (OH) based on the total amount 100 mol % of R$^7$ in the repeating unit included in the novolac resin.

3. The positive photosensitive resin composition of claim 1, wherein the novolac resin further comprises a repeating unit represented by the following Chemical Formula 40:

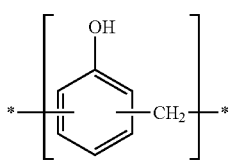

[Chemical Formula 40]

4. The positive photosensitive resin composition of claim 3, wherein the novolac resin comprises a repeating unit represented by the above Chemical Formula 6 and a repeating unit represented by the above Chemical Formula 40 at a mole ratio of about 30:70 to about 90:10.

5. The positive photosensitive resin composition of claim 1, wherein the novolac resin has a number average molecular weight (Mn) of about 1,000 g/mol to about 10,000 g/mol.

6. The positive photosensitive resin composition of claim 1, wherein the alkali soluble resin is a polybenzoxazole precursor.

7. The positive photosensitive resin composition of claim 6, wherein the polybenzoxazole precursor comprises a first polybenzoxazole precursor including a repeating unit represented by the following Chemical Formula 1, a repeating unit represented by the following Chemical Formula 2, or a combination thereof, and having a thermally polymerizable functional group at at least one terminal end of the first polybenzoxazole precursor; a second polybenzoxazole precursor including a repeating unit represented by the following Chemical Formula 4, a repeating unit represented by the following Chemical Formula 5, or a combination thereof; or a combination thereof:

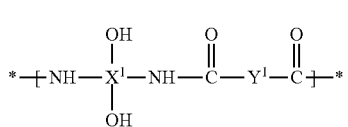

[Chemical Formula 1]

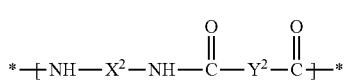

[Chemical Formula 2]

wherein, in Chemical Formulas 1 and 2,
X$^1$ is the same or different in each repeating unit and is each independently a substituted or unsubstituted C6 to C30 aromatic organic group, a substituted or unsubstituted tetravalent to hexavalent C1 to C30 aliphatic organic group, or substituted or unsubstituted tetravalent to hexavalent C3 to C30 alicyclic organic group,
X$^2$ is the same or different in each repeating unit and is each independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or a functional group represented by the following Chemical Formula 3, and $Y^1$ and $Y^2$ are the same or different in each repeating unit and are each independently a substituted or unsubstituted C6 to C30 aromatic organic group, a substituted or unsubstituted divalent to hexavalent C1 to C30 aliphatic organic group, or substituted or unsubstituted divalent to hexavalent C3 to C30 alicyclic organic group,

[Chemical Formula 3]

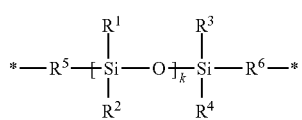

wherein, in Chemical Formula 3,
$R^1$ to $R^4$ are the same or different and are each independently hydrogen, substituted or unsubstituted C1 to C30 alkyl, substituted or unsubstituted C6 to C30 aryl, substituted or unsubstituted C1 to C30 alkoxy, or hydroxy,
$R^5$ and $R^6$ are the same or different and are each independently a single bond, substituted or unsubstituted C1 to C30 alkylene, or substituted or unsubstituted C6 to C30 arylene, and
k is an integer ranging from 1 to 50,

[Chemical Formula 4]

[Chemical Formula 5]

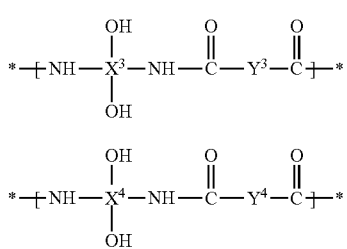

wherein, in Chemical Formulas 4 and 5,
$X^3$ and $X^4$ are the same or different and are each independently a substituted or unsubstituted C6 to C30 aromatic organic group, a substituted or unsubstituted tetravalent to hexavalent C1 to C30 aliphatic organic group, or substituted or unsubstituted tetravalent to hexavalent C3 to C30 alicyclic organic group, $Y^3$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and includes a thermally polymerizable organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

8. The positive photosensitive resin composition of claim 1, wherein the alkali soluble resin has a weight average molecular weight (Mw) of about 3,000 g/mol to about 50,000 g/mol.

9. A photosensitive resin film fabricated by using the positive photosensitive resin composition according to claim 1.

10. A semiconductor device including the photosensitive resin film according to claim 9.

\* \* \* \* \*

UNITED STATES PATENT AND TRADEMARK OFFICE
CERTIFICATE OF CORRECTION

PATENT NO. : 9,023,559 B2  
APPLICATION NO. : 13/303197  
DATED : May 5, 2015  
INVENTOR(S) : Jong-Hwa Lee et al.

Page 1 of 1

It is certified that error appears in the above-identified patent and that said Letters Patent is hereby corrected as shown below:

In the Claims

Claim 1, Column 35, Line 46 reads: "(E) about 50 parts by weight to about 900 ~~pars~~ by weight of"
and should read: "(E) about 50 parts by weight to about 900 <u>parts</u> by weight of"

Signed and Sealed this
Twenty-fourth Day of November, 2015

Michelle K. Lee
*Director of the United States Patent and Trademark Office*